United States Patent
Patel et al.

(10) Patent No.: US 6,949,202 B1
(45) Date of Patent: Sep. 27, 2005

(54) APPARATUS AND METHOD FOR FLOW OF PROCESS GAS IN AN ULTRA-CLEAN ENVIRONMENT

(75) Inventors: Satyadev R. Patel, Elk Grove, CA (US); Gregory P. Schaadt, Santa Clara, CA (US); Douglas B. MacDonald, Los Gatos, CA (US); Niles K. MacDonald, San Jose, CA (US)

(73) Assignee: Reflectivity, INC, Sunnyvale, CA (US)

( * ) Notice: Subject to any disclaimer, the term of this patent is extended or adjusted under 35 U.S.C. 154(b) by 138 days.

(21) Appl. No.: 09/649,569

(22) Filed: Aug. 28, 2000

Related U.S. Application Data

(63) Continuation-in-part of application No. 09/427,841, filed on Oct. 26, 1999, now Pat. No. 6,290,864.

(51) Int. Cl.[7] .............................. C23F 1/08; C23F 1/12
(52) U.S. Cl. .............................. 216/58; 216/63; 216/64; 216/67; 216/78; 156/345.29; 156/345.33; 156/345.37; 252/79.1
(58) Field of Search ...................... 156/345.29, 345.33, 156/345.41, 345.43, 345.48, 345.5, 345, 37; 216/58, 63, 64, 67, 73; 252/79.1

(56) References Cited

U.S. PATENT DOCUMENTS

| | | | |
|---|---|---|---|
| 3,511,727 A | 5/1970 | Hays | |
| 4,190,448 A | 2/1980 | Winters | |
| 4,310,380 A | 1/1982 | Flamm et al. | |
| 4,498,953 A | 2/1985 | Cook et al. | |

(Continued)

FOREIGN PATENT DOCUMENTS

| | | |
|---|---|---|
| EP | 0704884 A2 | 4/1996 |
| EP | 0 822 582 A2 | 2/1998 |
| EP | 0 822 584 A2 | 4/1998 |
| EP | 0 838 839 A2 | 4/1998 |

(Continued)

OTHER PUBLICATIONS

Streller et al., "Selectivity in Dry Etching of Si(100) and XeF2 and VUV Light", Elsevier Science B.V., Applied Surface Science, (1996), 106: pp. 341–346.

Vugts et al., "Si/XeF2 Etching: Temperature Dependence", J. Vac. Sci. Technol. A 14(5), (Sep./Oct. 1996), pp. 2766–2774.

Wang et al., "Gas-Phase Silicon Etching with Bromine Trifluoride", Transducers '97, 1997 International Conference on Solid–State Sensors and Actuators, Chicago (Jun. 16–19), pp. 1505–1508.

(Continued)

*Primary Examiner*—Allan Olsen
(74) *Attorney, Agent, or Firm*—Gregory R. Muir

(57) ABSTRACT

Processes for the addition or removal of a layer or region from a workpiece material by contact with a process gas in the manufacture of a microstructure are enhanced by the use of recirculation of the process gas. Recirculation is effected by a pump that has no sliding or abrading parts that contact the process gas, nor any wet (such as oil) seals or purge gas in the pump. Improved processing can be achieved by a process chamber that contains a baffle, a perforated plate, or both, appropriately situated in the chamber to deflect the incoming process gas and distribute it over the workpiece surface. In certain embodiments, a diluent gas is added to the recirculation loop and continuously circulated therein, followed by the bleeding of the process gas (such as an etchant gas) into the recirculation loop. Also, cooling of the process gas, etching chamber and/or sample platen can aid the etching process. The method is particularly useful for adding to or removing material from a sample of microscopic dimensions.

104 Claims, 6 Drawing Sheets

U.S. PATENT DOCUMENTS

| | | | |
|---|---|---|---|
| 4,551,197 A | * 11/1985 | Guilmette et al. | 216/93 |
| 4,695,700 A | 9/1987 | Provence et al. | |
| 4,740,410 A | 4/1988 | Muller et al. | |
| 4,749,440 A | 6/1988 | Blackwood et al. | |
| 4,789,426 A | 12/1988 | Pipkin | |
| 4,891,087 A | * 1/1990 | Davis et al. | 156/345.47 |
| 4,910,153 A | * 3/1990 | Dickson | 438/96 |
| 5,088,898 A | * 2/1992 | Fukumoto et al. | 417/347 |
| 5,206,471 A | 4/1993 | Smith | |
| 5,330,301 A | 7/1994 | Brancher | |
| 5,439,553 A | 8/1995 | Grant et al. | |
| 5,534,107 A | 7/1996 | Gray et al. | |
| 5,558,506 A | * 9/1996 | Simmons et al. | 417/393 |
| 5,672,242 A | 9/1997 | Jen | |
| 5,716,495 A | 2/1998 | Butterbaugh et al. | |
| 5,726,480 A | 3/1998 | Pister | |
| 5,753,073 A | 5/1998 | Jen | |
| 5,757,456 A | 5/1998 | Yamazaki et al. | |
| 5,835,256 A | 11/1998 | Huibers | |
| 5,858,065 A | 1/1999 | Li et al. | |
| 6,022,456 A | 2/2000 | Manning | |
| 6,051,503 A | 4/2000 | Bhardwaj | |
| 6,162,367 A | 12/2000 | Tai et al. | |
| 6,277,173 B1 | 8/2001 | Sadakata et al. | |
| 6,290,864 B1 | 9/2001 | Patel et al. | |
| 6,328,801 B1 | 12/2001 | Gary et al. | |
| 6,334,928 B1 | 1/2002 | Sekine et al. | |
| 6,355,181 B1 | 3/2002 | McQuarrie | |
| 2001/0002663 A1 | 6/2001 | Tai et al. | |
| 2002/0033229 A1 | 3/2002 | Lebouitz et al. | |

FOREIGN PATENT DOCUMENTS

| | | |
|---|---|---|
| EP | 0 878 824 A2 | 11/1998 |
| EP | 0878824 A2 | 11/1998 |
| EP | 0955668 A2 | 11/1999 |
| EP | 0878824 A3 | 1/2000 |
| JP | 1982/57098679 A | 6/1982 |
| JP | 1983/58130529 A | 8/1983 |
| JP | 1985/60057938 A | 4/1985 |
| JP | 1986/61134019 A | 6/1986 |
| JP | 1986/61181131 A | 8/1986 |
| JP | 1986/61187238 A | 8/1986 |
| JP | 1986/61270830 A | 12/1986 |
| JP | 1987/62071217 A | 4/1987 |
| JP | 1986/61053732 A | 3/1988 |
| JP | 1988/63155713 A | 6/1988 |
| JP | 1989/01208834 A | 8/1989 |
| JP | 1989/01217921 A | 8/1989 |
| JP | 1990/02250323 A | 10/1990 |
| JP | 1991/03012921 A | 1/1991 |
| JP | 1992/04096222 A | 3/1992 |
| JP | 1995/07029823 A | 1/1995 |
| JP | 1997/09251981 A | 9/1997 |
| JP | 1998/10313128 A | 11/1998 |
| JP | 1998/10317169 A | 12/1998 |
| WO | WO 98/05605 | 2/1998 |
| WO | WO 98/13856 | 4/1998 |
| WO | WO 98/32163 | 7/1998 |
| WO | WO 99/01887 | 1/1999 |
| WO | WO 99/03313 | 1/1999 |
| WO | WO 99/49506 | 9/1999 |
| WO | WO 00/52740 | 8/2000 |

OTHER PUBLICATIONS

Winters, H.F., "Etch Products from the Reaction of XeF2 with SiO2, SiO3, Si3N4, SiC, and Si in the Presence of Ion Bombardment", J. Vac. Science Technology B 1(4), (Oct.–Dec. 1983), pp. 927–931.

Winters et al., "The Etching of Silicon with XeF2 Vapor", Appl. Phys. Lett. 34(1), Jan. 1, 1979, pp. 70–73.

Gildemeister, J.M., "Xenon Difluoride Etching System", (Nov. 17, 1997).

"Xenon Difluoride Isotropic Etch System", Seeing is Believing, Surface Technology Systems Ltd. brochure, Newport, UK (date unknown).

Assorted promotional literature, Surface Technology Systems Ltd., Newport, UK (Jul. 28, 1999).

Aliev et al., "Development of Si(100) Surface Roughness at the Initial Stage of Etching in F2 and XeF2 Gases Ellipsometric Study", Surface Science 442 (1999), pp. 206–214.

Habuka et al., "Dominant Overall Chemical Reaction in a Chlorine Trifluoride–Silicon–Nitrogen System at Atmospheric Pressure", Japan Journal of Applied Physics vol. 38 (1999), pp. 6466–6469.

Hecht et al., "A Novel X-ray Photoelectron Spectroscopy Study of the AL/SiO2 Interface", J. Appl. Phys. 57 (1) Jun. 15, 1985, pp. 5256–5261.

Houle, F.A., "Dynamics of SiF4 Desorption During Etching of Silicon by XeF2", IBM Almaden Research Center, Apr. 15, 1987, pp. 1866–1872.

Flamm et al., "XeF2 and F–Atom Reactions with Si: Their Significance for Plasma Etching", Solid State Technol. 26, 117 (1983).

Ibbotson et al., "Plasmaless Dry Etching of Silicon with Fluorine–containing Compounds", Journal of Applied Physics, vol. 56, No. 10, Nov. 1984, pp. 2939–2942.

Ibbotson et al., "Comparison of XeF2 and F–atom Reactions with Si and SiO2", Applied Physics Letter, vol. 44, 1129 (1984).

Winters et al., "The Etching of Silicon with XeF2 Vapor", Applied Physics Letters, vol. 34 No. 1, 1979 pp. 70–73.

XACTIX, Inc., Marketing Brochure, Jun. 27, 1999.

Wang et al., "Gas–Phase Silicon Etching with Bromine Trifluoride", Transducers '97, International Conference on Solid–State Sensor and Actuators, Chicago, Jun. 16–19, 1997, pp. 1505–1508.

* cited by examiner

APPARATUS AND METHOD FOR FLOW OF PROCESS GAS IN AN ULTRA-CLEAN ENVIRONMENT

CROSS REFERENCE TO RELATED APPLICATION

This application is a continuation-in-part of commonly owned, U.S. patent application Ser. No. 09/427,841, inventors Patel et al., filed Oct. 26, 1999 now U.S. Pat. No. 6,290,864, the contents of which are incorporated herein by reference.

BACKGROUND OF THE INVENTION

1. Field of the Invention

This invention lies in the technology of the manufacture of microstructures, which include such devices as microelectromechanical structures, micro opto-electromechanical structures, and semiconductor devices. In particular, this invention addresses gas-phase etching and deposition procedures, with particular emphasis on those involving the etching of silicon. This invention further addresses apparatus that is especially useful in meeting the needs of gas-phase etching and deposition.

2. Description of the Prior Art

The use of selective etchants to remove sacrificial layers or regions in a multilayer structure without removal of an adjacent layer or region is a necessary and common step in the manufacture of semiconductor devices, microelectromechanical structures (MEMS), and micro opto-electromechanical structures (MOEMS). MEMS and MOEMS have found applications in inertial measurement, pressure sensing, thermal measurement, micro-fluidics, optics, and radio-frequency communications, and the range of possibilities for these structures continues to grow. One example of such a structure is a reflective spatial light modulator, which is a device consisting of a planar array of electrostatically deflectable mirrors, each microscopic in size. The device is used as a microdisplay system for high-resolution, large-screen projection. In such a device, the sacrificial layer temporarily supports the mirror structure during the fabrication process. Once the mirror structure is formed, the sacrificial layer is removed to leave gaps below the mirrors and a microhinge along one edge of each mirror to join the mirror to the remainder of the structure. The gap and the microhinge provide the mirror with the freedom of movement needed for its deflection. Devices of this type are described in U.S. Pat. No. 5,835,256 (issued Nov. 10, 1998, to Andrew Huibers, assignor to Reflectivity, Inc., Santa Clara, Calif.). The contents of U.S. Pat. No. 5,835,256 are incorporated herein by reference.

The success of an etch step in the manufacture of microstructures depends on a number of factors, prominent among which are the completeness and uniformity of the etch among the areas to be etched, both across and throughout the microstructure surface. For deflectable mirror structures, the integrity of the microhinges (the structure undergoing mechanical deformation) is important to achieving uniform microstructure properties and a high yield of defect-free product. For other MEMS and for semiconductor devices, completeness and uniformity of the etch are likewise critical to insure that features on all areas of the structure function fully and property when in use. These factors are important in both isotropic and anisotropic etching. Isotropic etching is of particular interest, in structures where the purpose of the etch is to remove a sacrificial layer that is intervening between functional layers or between a functional layer and a substrate. The bulk of the sacrificial layer in these structures is accessible to the etchant only through vias in the functional layer and etchant must proceed laterally outward from the vias. The structures described in U.S. Pat. No. 5,835,256 above preferably employ isotropic etchant for this reason. The "vias" in these structures are the narrow gaps between the facing edges of adjacent mirror elements or between a mirror edge and an adjacent feature. Likewise, in the manufacture of any MEMS or semiconductor, all features on the structure surface must be fully defined and all materials that are not functional in the finished product must be fully removed.

Of potential relevance to certain embodiments of this invention is the prior art relating to particular etchant gases. Prominent among the etchants that are used for the removal of sacrificial layers or regions in both isotropic and anisotropic etching procedures are noble gas fluorides and halogen fluorides. These materials, used in the gas phase, selectively etch silicon relative to other materials such as silicon-containing compounds, non-silicon elements, and compounds of non-silicon elements. Descriptions of how these materials are used in etching procedures appear in co-pending U.S. patent application Ser. No. 09/427,841 and in portions of the present specification that follow. The invention claimed in application Ser. No. 09/427,841 offers an improvement in the selectivity of the silicon etch. Further means of improving the etch process particularly the uniformity and thoroughness of the etch, continue to be sought, since improvements in these features of the process significantly benefit the cost and reliability of the products manufactured.

The method of the present invention is useful for producing deflectable elements (deflectable by electrostatic or other means) which, if coated (before or after gas phase processing) with a reflective layer, can act as an actuatable micromirror. Arrays of such micromirrors can be provided for direct view or projection display systems (e.g. projection television or computer monitors). Also, if the micromirrors are provided alone or in an array and of a size of 100 micrometers or more (preferably 500 micrometers or more), the mirror is useful for steering light beams, such as in an optical switch. The present invention is also adaptable to processing (e.g. etching) semiconductor devices, and is not limited to MEMS devices.

SUMMARY OF THE INVENTION

The present invention provides improvements in the apparatus and methods used for the etching of layers or areas, or for the addition or deposition of layers or elements, in or on a microstructure. In one such improvement, a recirculating and/or cooling system is introduced into the etch or deposition process to thereby provide a controlled reaction environment while improving the effectiveness of the process gas and the efficiency of the process. Recirculation has not been done in the prior art due to the risk of introducing foreign bodies or substances into the ultra-clean reaction environment and contaminating the sample, a risk that is associated with the use of recirculation pumps. One embodiment of this invention thus resides in the discovery that recirculation can indeed be performed without such risk. Another improvement provided by this invention is the use of an etching or deposition chamber that contains internal structural features that help distribute the incoming process gas over the sample surface. This distribution serves to reduce, minimize, or even eliminate the occurrence of localized areas of high concentration of the process gas and any resulting "hot spots" on the sample surface. Still another improvement is the design and use of a reciprocating pump for recirculating the process gas. The pump fully seals the process gas from the environment without the use of lubricants or of any materials that may contaminate the environment or are susceptible to corrosion by the process gas. The pump nevertheless provides process gas at a highly controllable flow rate to the chamber in which the reaction occurs. Use of the pump thus leads to the reduction of the effluents and an increase in product uniformity. Each of these improvements results in an increase in the efficiency of the process, and to the yield and quality of the product, and each can be used either alone or in combination with one or more of the others.

The internal structural features of the reaction chamber that contribute to the distribution of the incoming process gas are a baffle that deflects the incoming gas stream to prevent the stream from striking the sample surface directly, a perforated plate that distributes the gas stream over a broad spatial area, or a combination of such a baffle and perforated plate. When both the baffle and perforated plate are present, the plate is preferably positioned between the baffle and the sample. Whether the plate is used alone or in combination with a baffle, the plate is arranged such that the process gas flow must pass through the perforations in the plate before reaching the sample, and the perforations are sized and spatially arranged in the plate to promote the distribution of the process gas stream across the perforation array. With these features, the process can be performed with greater control over the quantity, flow rate, and flow pattern of the process gas. The benefits that this offers include a uniform reaction over the sample area and an improved chemical efficiency resulting in greater uniformity, a higher yield of defect-free product, and improved reproducibility. When the process is a selective etching process, selectivity of the etch toward silicon or any other materials sought to be etched is also improved as a result of greater control over the reaction conditions.

While the recirculation described above can be effected by use of any of a variety of pumps of varying construction and operation, one such pump, which is described in detail below, is a reciprocating pump constructed of a housing with bellows-type wall sections and one or more movable internal partitions that divide the pump interior into individual chambers. Each partition engages the bellows-type wall sections such that movement of the partition in one direction causes a first chamber to expand while a second chamber contracts, followed by movement of the partition in the opposite direction causing the first to contract while the second expands. Continuous cycles of back and forth movement of the partition, synchronized with the opening and closing of separate inlet and outlet valves for each chamber cause the chambers to alternate between drawing the gas in and discharging the gas. The result is a relatively continuous and steady discharge of gas during both strokes of the pump cycle. A pump of this design allows the operator to modify the flow rate of process gas with a high degree of efficiency and control by simply adjusting the partition speed and cycle period. These benefits are achieved without danger of corrosion of the pump or of contamination of the process gas with pump lubricant or any other liquid or particulate matter from the pump.

This is one example of a dry pump, which term is used herein to denote a pump that contains no liquid components such as those that might otherwise be used as seals or lubricants, that come into contact with the process gas stream. Other dry pumps may also be used. This particular dry pump however offers the further advantage of avoiding any introduction of a purge gas into the flow stream.

Also disclosed are cooling systems and methods for cooling the process gas, whether recirculated or not. The cooling can be directly to the sample being processed, to the processing/etching chamber, or to the process/etching gas prior to arrival in the process chamber. Such cooling is particularly suitable for etching silicon, and particularly with non-plasma phase halides (and preferably with vapor phase fluorides that do not have external electric fields or electromagnetic energy added thereto).

DETAILED DESCRIPTION OF THE INVENTION AND PREFERRED EMBODIMENTS

While this invention is susceptible to a variety of constructions, arrangements, flow schemes, and embodiments in general, the novel features that characterize the invention are best understood by first reviewing a typical process flow arrangement in which the various aspects of this invention might be used.

Figure 1:
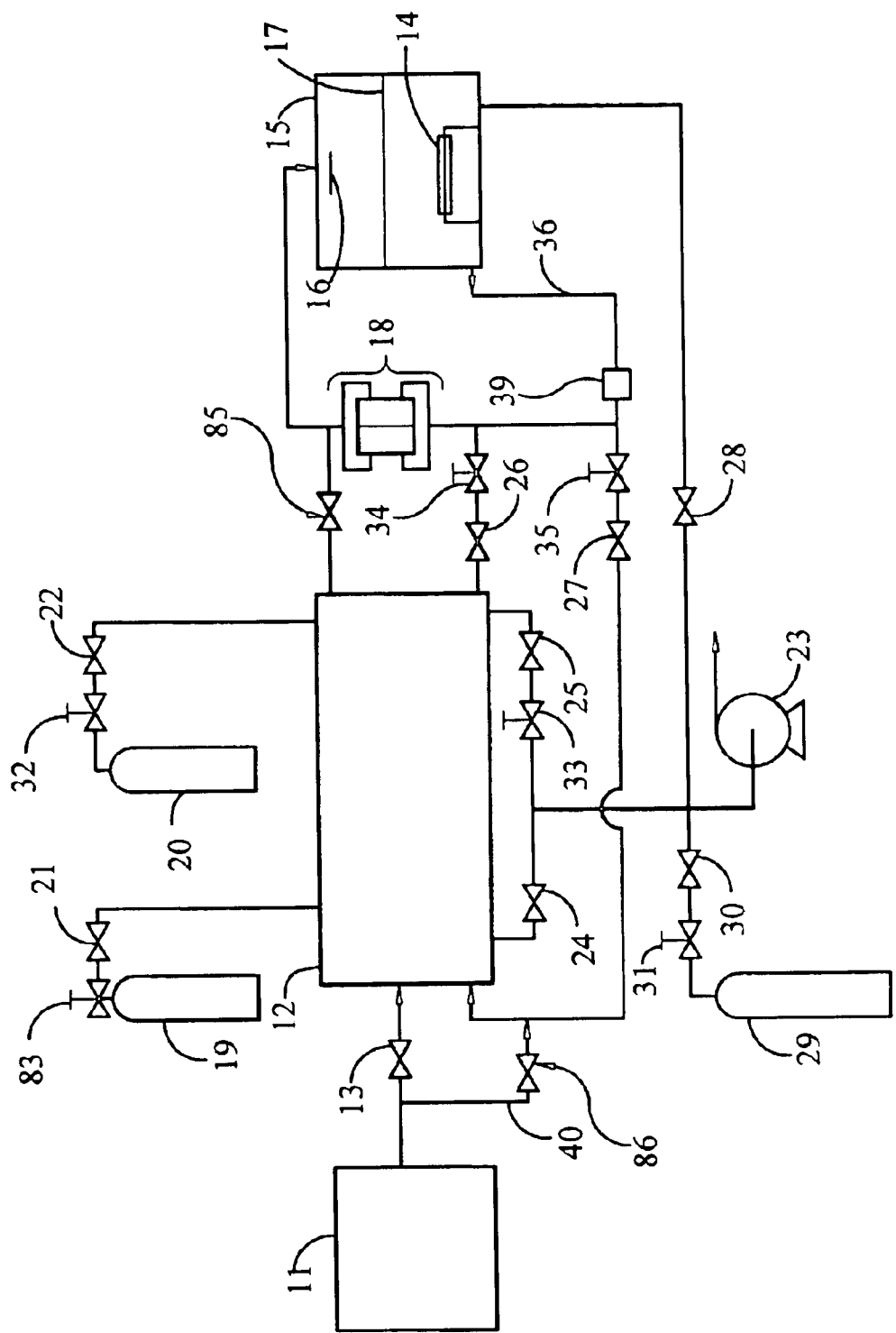
FIG. 1 is a process flow diagram of an example of a process for etching silicon using the methods and apparatus of this invention.

FIG. 1 represents such a process flow arrangement in which the process is an etching process. The etchant gas originates in a source chamber 11. An example of an etchant gas that is conveniently evaporated from a liquid is bromine tifluoride, whereas an example of an etchant gas that is conveniently sublimated from solid crystals is xenon difluoride. Effective results can be achieved by maintaining the crystals under 40 degrees C. (e.g. at a temperature of 28.5° C.). (Xenon difuloride is only one of several etchant gases that can be used. Examples of other gases are presented below.) The sublimation pressure of xenon difluoride crystals at 28.5° C. is 5–11 mbar (4–8 torr). An expansion chamber 12 receives xenon difluoride gas from the crystals in the source chamber(s) 11, and a shutoff valve 13 is positioned between the source and expansion chambers. The sample to be etched 14 is placed in an etch chamber 15, which contains a baffle 16 and a perforated plate 17 as referred to in the Summary of the Invention (above), and the reciprocating pump 18 referred to in the Summary of the Invention is positioned between the expansion chamber 12 and the etch chamber 15. (The reciprocating pump and its valves are shown in more detail in a FIGS. 4a and 4b and described below.)

Also shown are two individual gas sources 19, 20 supplying the expansion chamber 12 through shutoff valves 21, 22, a vacuum pump 23 and associated shutoff valves 24, 25, 26, 27, 28 to control the evacuation of the chambers, a third gas source 29 serving as a pump ballast with an associated shutoff valve 30 to prevent backstreaming from the pump 23, and manually operated needle valves 31, 32, 33, 34, 35, 83 to set the gas flow rates through the various lines and to permit fine adjustments to the pressures in the chambers. When xenon difluoride is used, the expansion chamber 12 and the etch chamber 15 are typically maintained at around room temperature (e.g. 25.0° C.). However, the expansion chamber and etch chamber could also be heated (e.g. to between 25 and 40 degrees C.), though this would likely be performed in conjunction with directly cooling the sample being processed, as will be discussed below. A recirculation line 36 permits gas to flow continuously through the etch chamber 15 in a circulation loop that communicates (via valves 26, 27, and 34, 35) with the expansion chamber 12 and reenters the etch chamber 15 by way of the reciprocating pump 18. Valve 85 permits gas transfer between expansion chamber 12 and etch chamber 15 via a portion of the recirculation line 36 without traversing recirculation pump 18. Valve 86 in path 40 permits introduction of etchant gas into the expansion chamber 12 to replenish the etchant mixture during the etching process. The valves are preferably corrosive gas resistant bellows-sealed valves, preferably of aluminum or stainless steel with corrosive reisistant O-rings for all seals (e.g. Kalrez™ or Chemraz™). The needle valves are also preferably corrosion resistant, and preferably all stainless steel. As an optional feature, a filter 39 can be placed in the recirculation line 36 to remove etch byproducts from the recirculation flow, thereby reducing the degree of dilution of the etchant gas in the flow. The filter can also serve to reduce the volume of effluents from the process. The etch chamber 15 (or in a more generic sense, the reaction chamber 15, since this invention extends to deposition and other uses of reactive process gases in addition to etching) can be of any shape or dimensions, but the most favorable results will be achieved when the internal dimensions and shape of the chamber are those that will promote even and steady flow with no vortices or dead volumes in the chamber interior. A preferred configuration for the etch chamber is a circular or shallow cylindrical chamber, with a process gas inlet port at the center of the top of the chamber, plus a support in the center of the chamber near the bottom for the sample, and an exit port in the bottom wall or in a side wall below the sample support. The baffle 16 is placed directly below the entry port. The distance from the port to the upper surface of the baffle is not critical to this invention and may vary, although in preferred embodiments of the invention the distance is within the range of from about 0.1 cm to about 6.0 cm, and most preferably from about 0.5 cm to about 3.0 cm. Although its shape is not shown in FIG. 1, the baffle is preferably circular or otherwise shaped to deflect the gas stream radially over a 360° range.

Figure 2:
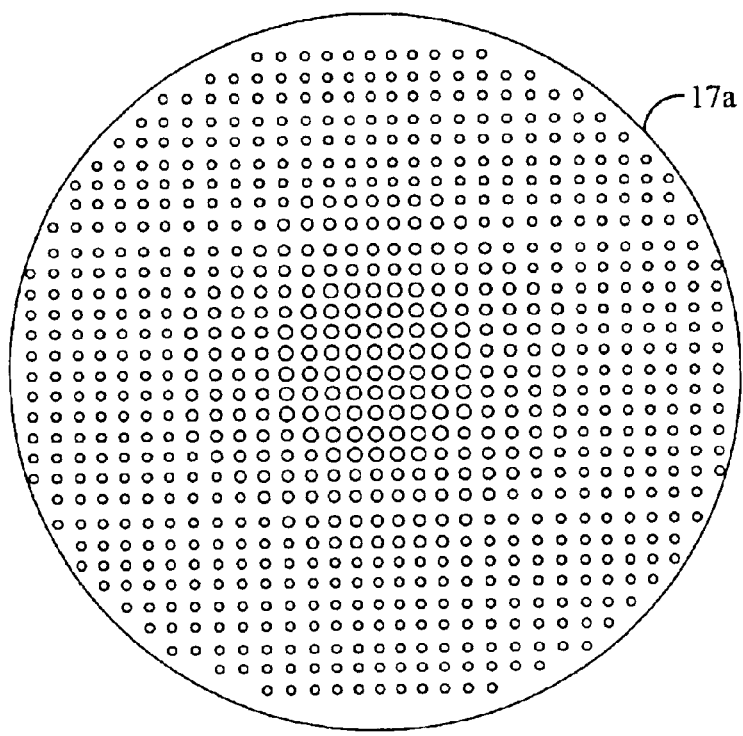
FIG. 2 is a plan view of one example of a perforated plate that can be used in the practice of this invention.
Figure 3:
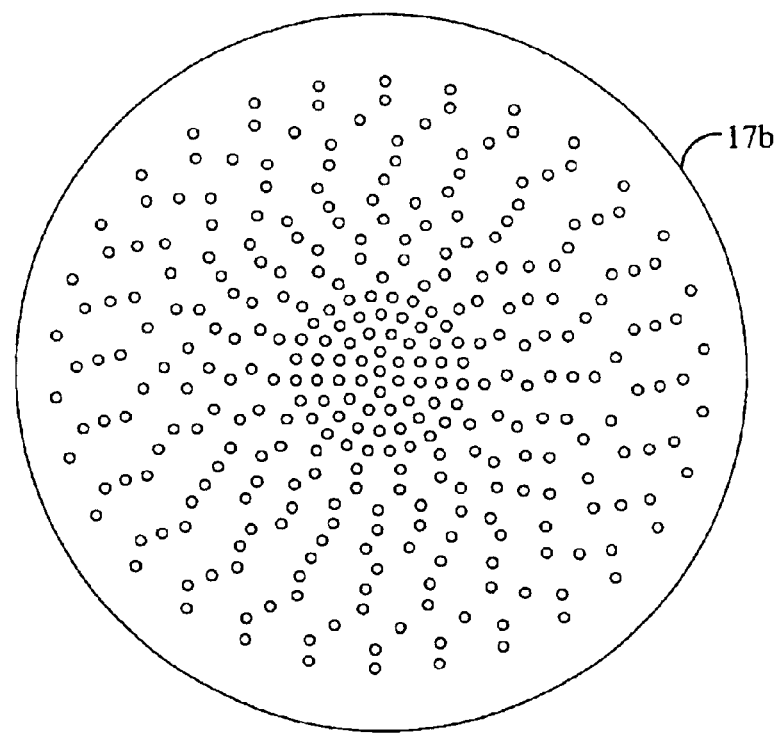
FIG. 3 is a plan view of a second example of a perforated plate that can be used in the practice of this invention.

The perforated plate 17 is wider than the baffle 16 and preferably transmits all gas flow towards the sample. A preferred configuration for the perforated plate is one that matches the geometry of the sample; thus, for a circular sample the perforated plate is preferably circular as well. Two examples of perforated plates 17a and 17b are shown in FIGS. 2 and 3, respectively. The perforated plate serves to enhance the distribution of the process gas over the sample below by forcing the gas to pass through small-diameter holes in the plate before reaching the sample. The small diameter of each hole itself causes dispersion of the gas stream as it passes through and emerges from the hole. For a given pump flow rate, the perforation array, and particularly the locations and sizes of the holes, is designed to achieve uniform etch progression over the whole sample. This leads to improved sample and process uniformity.

As noted above, the baffle and the perforated plate may each be used individually to achieve a uniform treatment of the sample. The structure shown in the drawings depicts the preferred arrangement which includes both a baffle and a perforated plate. In this arrangement, the gas passing over the edges of the baffle strikes the peripheral regions of the plate first. Further distribution of the gas over the entire perforated plate and hence through all the holes can be achieved by arranging the holes to create more resistance to the gas at regions toward the periphery than at the center of the plate. This can be done in a variety of ways, two of which are shown in the Figures. In FIG. 2, the holes decrease in diameter with increasing distance from the center of the plate. The holes in this arrangement are of three sizes; the outermost holes being the smallest, those in the central region the largest, and those in the intermediate region being of intermediate size. In one specific example of a size distribution, the outer region holes are approximately 0.074 inch (1.9 mm) in diameter, the holes in the central region are 0.125 inch (3.2 mm) in diameter, and the holes in the intermediate region are 0.100 inch (2.5 mm) in diameter. This is only an example; in other examples holes of different diameters may be used and the gradation may be more continuous from center to edge. In FIG. 3, the holes are all of the same diameter but the spacing between the holes increases with increasing distance from the center of the plate. An example of an arrangement of this type is one in which the holes are 0.080 inch (2.0 mm) in diameter.

In embodiments of the invention that employ both a baffle and a perforated plate in the arrangement shown in FIG. 1, the distance from the baffle 16 to the upper surface of the perforated plate 17 is not critical to this invention and may vary, depending on the other dimensions of the etching chamber, the flow rate of the incoming gas, and other system parameters. In preferred embodiments of this aspect of the invention, the distance is within the range of from about 0.1 cm to about 10 cm, and most preferably from about 1.0 cm to about 4.0 cm. In one specific example, the distance from the port to the upper surface of the baffle is approximately 2.5 cm, and the distance between the baffle and the upper surface of the perforated plate is 2.0 cm.

Many alternatives to the process scheme described above can be used. Additional gas sources and chambers, for example, can be utilized. The air distribution system within the etching chamber can also be varied, for example by including U-shaped or cone-shaped baffles, or by using additional perforated plates and/or baffles. Common features among all such variations, however, are recirculation of the etchant gas and a pump disposed within the recirculation loop.

Figure 4A:
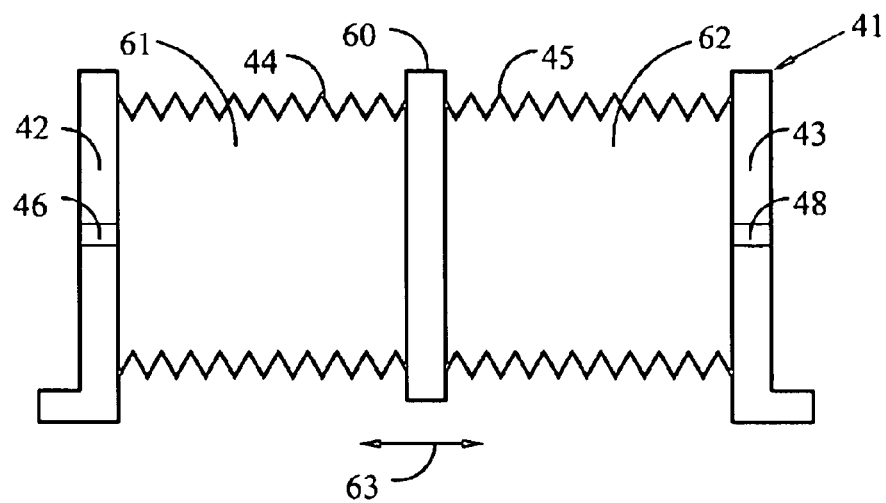
FIG. 4a is a side elevation view of one example of a reciprocating pump in accordance with this invention.
Figure 4B:
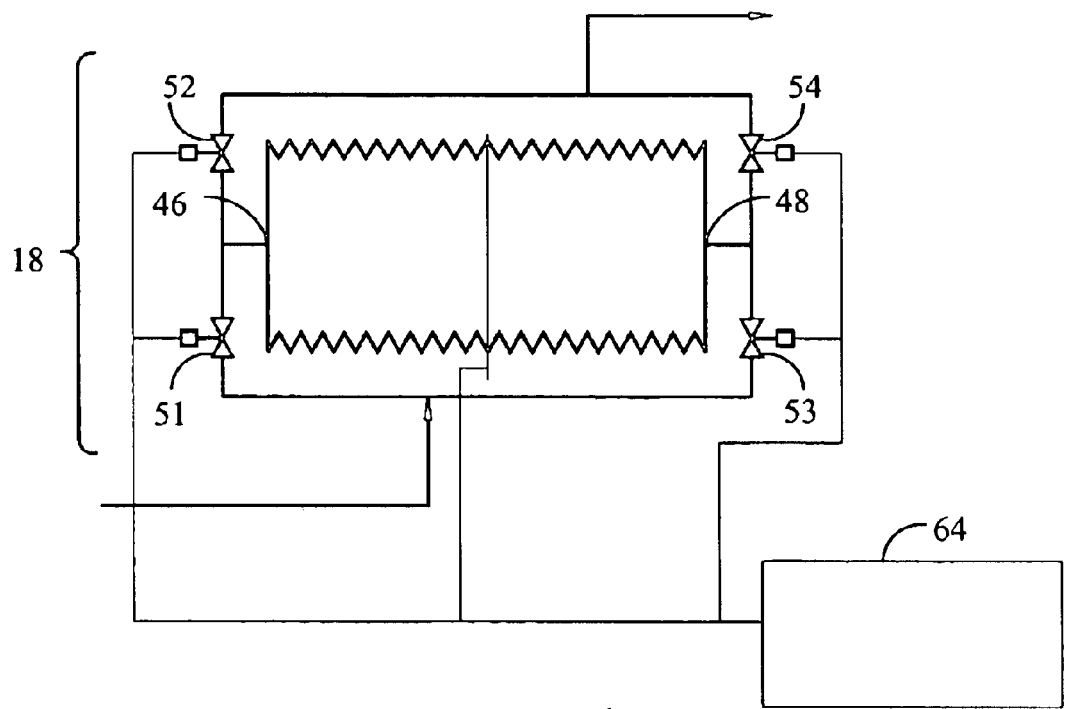
FIG. 4b is a pump flow diagram of the reciprocating pump of FIG. 4a together with associated flow lines and shutoff valves.

FIGS. 4a and 4b are diagrams of an example of a reciprocating pump 18 that can be used in the practice of this invention. The design shown in these diagrams can be varied in numerous ways, such as by increasing the number of chambers to three or more, or by arranging a series of such pumps in parallel. The following discussion is directed to the particular design shown in these diagrams.

The side elevation view of FIG. 4a shows the pump housing 41, which consists of two stationary end walls 42, 43 joined by bellows-type side walls 44, 45. The bellows-type side walls 44, 45 are so-called because they are either pleated like an accordion or otherwise constructed to permit bellows-type expansion and contraction. The end walls 42, 43 and the bellows-type side walls 44, 45 together fully enclose the interior of the pump except for inlet/outlet ports on each side wall. The arrangement of these ports is shown in the pump flow diagram of FIG. 4b, the left side wall 42 having one inlet/outlet port 46, and the right side wall 43 likewise having one inlet/outlet port 48. Remotely controlled shutoff valves 51, 52, 53, 54 are placed on the external lines leading to or from each inlet/outlet port. For fail-safe operation, shutoff valves 51, 54 are normally open and shutoff valves 52, 53 are normally closed.

The movable partition 60 shown in FIG. 4a divides the pump interior into two chambers 61, 62, the partition and its connections to the remaining portions of the housing being fluid-impermeable so that the two chambers are completely separate with no fluid communication between them. The partition 60 joins the bellows-type side walls 44, 45 and moves in the two directions indicated by the two-headed arrow 63. The movement is driven by a suitable drive mechanism (not shown) capable of reciprocating movement. Many such drive mechanisms are known to those skilled in the art and can be used. In the view shown in FIG. 4a, movement of the partition to the left causes the left chamber 61 to contract and the right chamber 62 to expand. With the pump shutoff valves appropriately positioned, i.e., valves 52 and 53 open and valves 51 and 54 closed, the contracting left chamber 61 will discharge its contents through its inlet/outlet port 46 while the expanding right chamber 62 will draw gas in through its inlet/outlet port 48. Once the partition 60 has reached the end of its leftward travel, it changes direction and travels to the right and the shutoff valves are switched appropriately, causing the expanded right chamber 62 to contract and discharge its contents through its inlet/outlet port 48 while the contracted left chamber 61 expands and draws fresh gas in through its inlet/outlet port 46. In this manner, the pump as a whole produces a gas flow in a substantially continuous manner, the discharge coming alternately from the two chambers. A controller 64 governs the direction and range of motion, and the speed and cycle time of the partition 60, and coordinates the partition movement with the opening and closing of the shutoff valves 51, 52, 53, 54. Conventional controller circuitry and components can be used.

The pump for recirculating the process gas as shown, and others within the scope of this invention, has no sliding or abrading parts or lubricant that come into contact with the process gas. Alternative pumps that meet this criteria are possible, including pumps with expandable balloon chambers, pumps with concentric pistons connected by an elastic sealing gasket, or peristaltic pumps. The pump materials, including the bellows-type walls, can thus be made of materials that are resistant or impervious to corrosion from the etchant gas. One example of such a material, useful for operating temperatures below 50° C., is stainless steel. Others are aluminum, Inconel, and Monel. Still others will be readily apparent to those experienced in handling these gases. While the capacity and dimensions of the pump and its chambers may vary, a presently preferred embodiment is one in which the change in volume of each chamber upon the movement of the partition across its full range is approximately from 0.05 to 4.2 L, though preferably from 0.1 to 1.5 L, with one example being 0.5 L. Larger chamber sizes (e.g. 5 to 20 L) are possible, which, if combined with a slower pumping speed, can benefit from lower wear on the pump. At a partition speed of one cycle every two seconds, the pump rate (for 0.5 L) will be 30 L/min. Different combinations of pump sizes and pump speeds are possible, though the preferred pump volume per time is between 7 and 85 L/min, with a preferred range of from 15 to 46 L/min.

The pump described above can be lined with a suitable lining to further reduce particulate contamination of the process gas mixture during etching. Pumps that are not of the bellows type can also be used. The preferred pumps are those that are resistant to corrosion by the process gas mixture and those that are designed to avoid introducing particulate or liquid material into the process gas mixture. Dry pumps, i.e., those that do not add exogenous purge or ballast gas into the process gas mixture, are preferred. Alternatively, the process gas could be circulated by temperature cycling (with large variations in the heating and cooling of the recirculation path).

The following is a generalized description of the etching process and its chemical parameters. This description is included to show the context in which the features described above are most likely to be used.

The apparatus and methods of this invention can be used in etching processes that are known in the art and in the literature. These processes include the use of dry-etch gases in general, including C12,HBr, CC12F2 and others. Preferred etchant gases, particularly for etching silicon, are gaseous halides (e.g. fluorides) such as noble gas fluorides, gaseous halogen fluorides, or combinations of gases within these groups (again, preferably without energizing the gas, other than heating to cause vaporization or sublimation). The noble gases are helium, neon, argon, krypton, xenon and radon, and among these the preferred fluorides are fluorides of krypton and xenon, with xenon fluorides the most preferred. Common fluorides of these elements are krypton difluoride, xenon difluoride, xenon tetrafluoride, and xenon hexafluoride. The most commonly used noble gas fluoride in silicon etch procedures is xenon difluoride. Halogen fluorides include bromine fluoride, bromine trifluoride, bromine pentafluoride, chlorine fluoride, chlorine trifluoride, chlorine pentafluoride, iodine pentafluoride and iodine heptafluoride. Preferred among these are bromine trifluoride, bromine trichloride, and iodine pentafluoride, with bromine trifluoride and chlorine trifluoride the more preferred. Combinations of bromine trifluoride and xenon difluoride are also of interest. The etch process is generally performed at a pressure below atmospheric. It is preferred that the etchants described herein be used in the gaseous state (e.g. non-plasma) or otherwise in the absence of added energy (except heat to aid sublimation or vaporization of the starting etchant gas or liquid), and in the absence of electric fields, UV light or other electromagnetic energy, or other added fields or energy sources which would energize the etchant gas beyond it's normal energy as a gas at a particular temperature.

Figure 5:
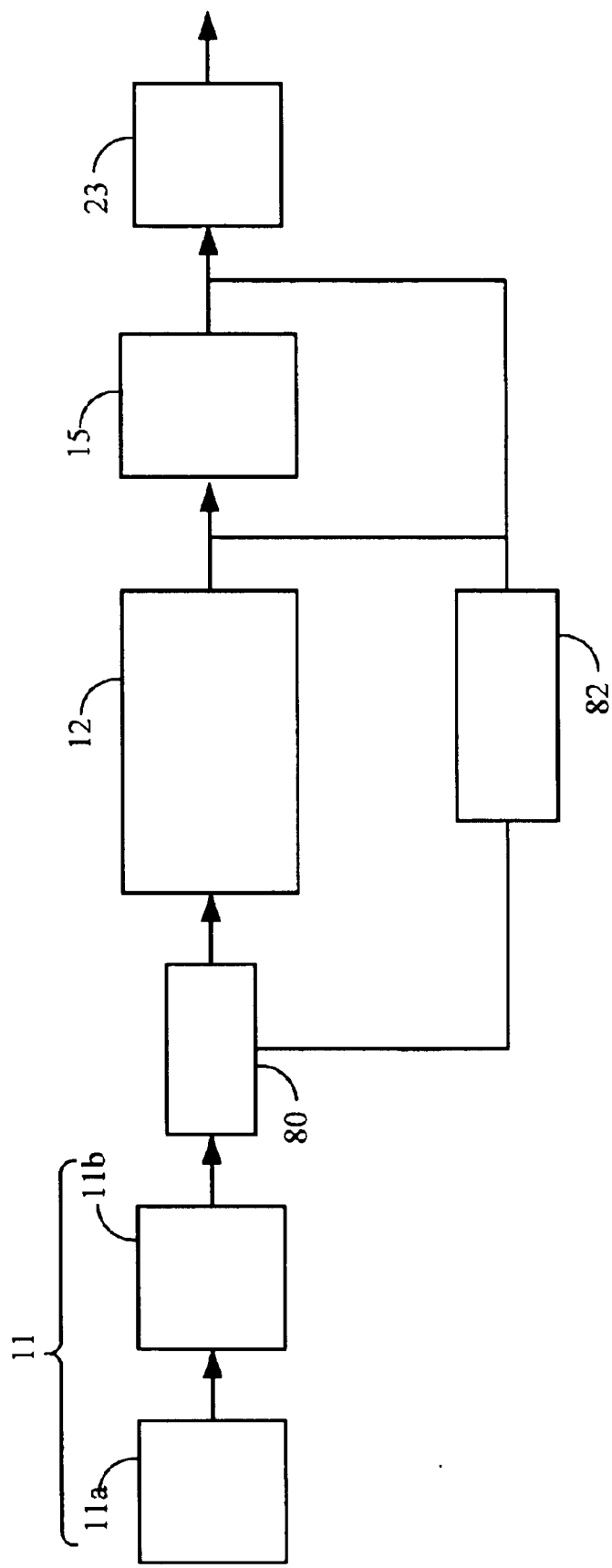
FIG. 5 is a process flow diagram showing a further embodiment of the invention.

In fact, in a preferred embodiment of the present invention, the etchant gas (once drawn from source chamber 11 for etching) is cooled (or, the sample is cooled). Cooling the etchant gas, etchant chamber, and/or sample has been found to be particularly helpful in the production of MEMS devices in the present invention, and specifically for making cantilever type movable beam structures or other hinged microelectromechanical structures which involve etching with a vapor phase etchant (e.g. a fluoride vapor etchant). As can be seen in FIG. 5, a gas cooling unit 80 is provided to cool the process gas. The cooling unit 80 is illustrated in FIG. 5 as being disposed between the process gas source and the (optional) expansion chamber. However, the cooling unit could also be disposed between the expansion chamber 12 and the etching chamber 15 or anywhere else that will cool the process gas to the desired temperature. If the process gas is cooled, it should preferably not be cooled at or below the condensation temperature (for the partial pressure of the etchant that is used). In a further embodiment of the invention, the sample 14 itself is directly cooled (e.g. by cooling the sample holder/platen in the process chamber), or the etching chamber 15 or expansion chamber 12 is cooled. If the sample platen is cooled, a differential pressure can be applied to increase contact of the sample with the platen so as to in turn increase the cooling of the sample. Such cooling is particularly suited to etching silicon (e.g. amorphous silicon) relative to a dielectric material (e.g. a nitride or oxide of silicon). The cooling is especially desirable when used in a process for removing one material under another material (e.g. as in making MEMS structures such as micromirrors).

The cooling unit can be any suitable design, such as a standard cooling coil or rib design for cooling the process gas, or a cooling device for directly cooling the process chamber or sample holder. If cooling the process gas, the cooling unit should cool to a temperature below room temperature (approx. 22 degrees C.), preferably to a range of 0 to 19 degrees C., and more preferably to a range of about 1 to 12 degrees C. Tests were performed on a silicon nitride layer (over Ti layer on glass) to determine the amount of etching observed (with xenon difluoride gas exposure for a fixed time) depending upon temperature. A portion of the silicon nitride layer was covered with photoresist and the uncovered portion was etched to determine the etching rate at a particular temperature; specifically, the etch rate was calculated from the exposure time and the measured step height between the photoresist protected silicon nitride and the exposed silicon nitride once the photoresist was stripped with acetone. Because of the low etching rates when the process gas is cooled (and the difficulty in measuring the small amount of etch at very low temperatures) the process gas etching rate was determined at higher temperatures (e.g. 90 and 120C.) and extrapolated. (The SiN etched more slowly at 90C. As it is known that silicon etches more quickly at lower temperatures, greater selectivity can be achieved between SiN and Si by lowering the process temperature, or preferably by lowering the temperature of the sample itself). In a further embodiment of the invention, the process gas is heated, but at the same time the sample is directly cooled (e.g. by cooling the sample holder/platen, or by feeding an inert cooling gas directly to the sample). In this way, condensation is avoided, yet the selectivity benefits of lower temperature are maintained. In another embodiment, the cooling temperature is modulated from high (just below room temperature at the start of the etch process) to low depending on the partial pressure of the unreacted etchant in the process gas; this helps to avoid condensation of the etchant in the system.

Figure 6:
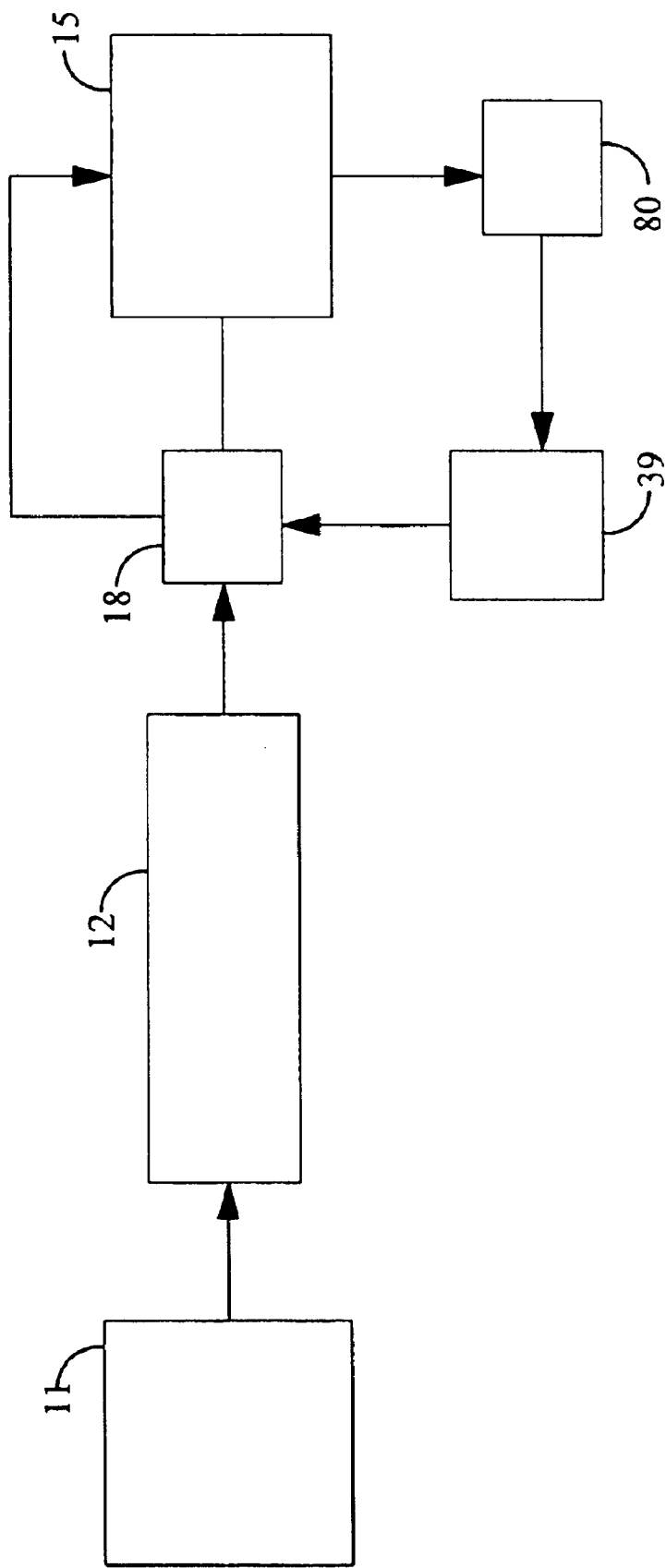
FIG. 6 is a process flow diagram showing a still further embodiment of the invention.

If desired, a temperature monitor 82 can monitor the process gas temperature at a point before and/or after the process gas passes through the etching chamber and can be used for controlling the cooling unit. FIG. 6 shows an embodiment that has the recirculation capabilities of FIG. 1 and the cooling capabilities of FIG. 5. An optional filter 39 is also shown in FIG. 6, as is pump 18, source chamber 11, expansion chamber 12, etch chamber 15 and cooling unit 80. For clarity, the various valves, conduits, gas diluents, and other peripheral structure of FIG. 1 have been omitted in FIGS. 5 and 6.

While the source chamber 11 can be a single chamber, the arrangement shown in FIG. 5 is an optional one in which the source chamber is actually a pair of chambers 11a and 11b arranged in series. The first of these chambers 11a contains the source material primarily in its condensed form, i.e., either as crystals to be sublimated or liquid to be vaporized. The second chamber 11b receives the source material gas evolved by sublimation from the crystals or by vaporization from the liquid in the first chamber 11a. To maintain these phases, the two chambers 11a and 11b will preferably be maintained at different temperatures (preferably at least 5 degrees C. difference), the former 11a at the lower temperature to keep the material in its condensed form (solid crystals or liquid) and the latter 11b at the higher temperature (and possibly a higher pressure as well) to keep the material in the vapor form (and to avoid the problem of condensation) at a pressure sufficiently high to allow it to be supplied to the succeeding chambers at the pressures needed in those chambers, In one embodiment, the two chambers are held at temperatures above room temperature, with chamber 11b held at a temperature from 2 to 24 degrees C. (preferably around 5 to 10 degrees C.) higher than the temperature of chamber 11a. Such a two-chamber embodiment could likewise be utilized in a system such as that illustrated in FIGS. 1 and 6. Chambers 11a and 11b could also be arranged in parallel.

The terms "sample" and "microstructure" are used herein to denote the article from which a material is sought to be removed or to which a material is to be added, whether the material forms a layer among a plurality of layers, layers among a plurality of layers or a region adjacent to other regions in the same plane. The "sample" may thus be a single mirror element and its associated layers of other materials, a test pattern, a die, a device, a wafer, a portion of a wafer, or any article from which a portion is to be removed or added. The invention is particularly suitable for processes where the size of the portion of material that is being added or removed is less than 5 mm in at least one of its dimensions, preferably less than 1 mm, more preferably less than 500 $\mu$m, and most preferably less than 100 $\mu$m. The invention is also well suited to adding or removing material (e.g., in the form of holes or layers) in a submicron environment (e.g. in the range of 10 nm to less than 1000 nm) (as sometimes needed, for example, in MEMS and MOEMS).

Figure 7:
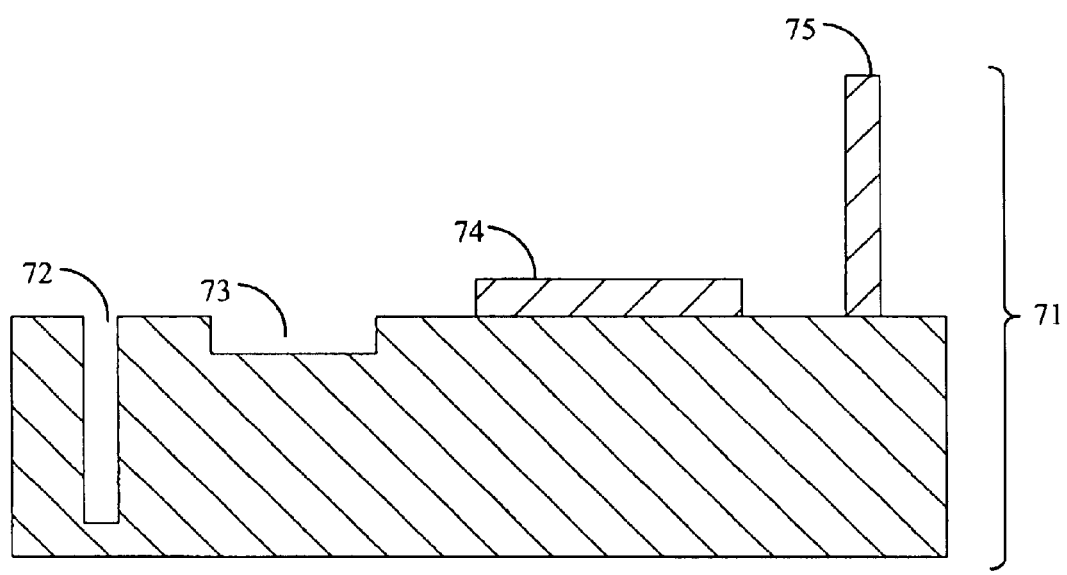
FIG. 7 is a cross section of a sample after being subjected to different processes in accordance with the present invention, as an illustration of different effects that can be achieved by the invention.

FIG. 7 is a cross section of a sample 71 (such as a semiconductor or a MEMS or MOEMS structure) showing features that can be formed by processes in accordance with the present invention. Etching processes in accordance with the invention can be performed to form a hole 72 which is relatively deep and narrow, or to remove a layer to form a depression 73 which is relatively wide and shallow, whereas the addition of material can be achieved by deposition to form a surface layer 74 which is relatively wide and shallow or a wall or post 75 which is relatively high and narrow. The dimension ranges cited in the preceding paragraph refer to the smallest dimension of each of these features, i.e., the width of the hole 72, the height of the depression 73, the depth of the added layer 74, and the width of the wall or post 75.

In the system depicted in the drawings, as well as other systems within the scope of this invention, a single charge of etchant can be placed in the source chamber or the expansion chamber, then released (with or without diluents) into the recirculation loop. Additional etchant can be introduced to replenish the circulating stream as the amount of etchant in the recirculation loop decreases over time. Other variations of the process will be apparent to those skilled in the art.

When the material to be removed by etching is silicon, certain etching processes supply the etchant gas as a mixture of gases of which one component is the etchant gas itself (or a mixture of etchant gases) while other components are non-etchant diluents. Whether the gas consists entirely of etchant gas(es) or contains non-etchant components as well, the rate of the etch reaction may vary with the partial pressure of the etchant gas. The partial pressure may vary, but in most applications, particularly those in which silicon is being etched, best results will be obtained with the etchant gas at a partial pressure of at least about 0.1 mbar (0.075 torr), preferably at least about 0.3 mbar (0.225 torr), more preferably within the range of from about 0.3 mbar (0.225 torr) to about 30 mbar (22.5 torr), and most preferably from about 1 mbar (0.75 torr) to about 15 mbar (11.25 torr). These pressure ranges are particularly applicable to xenon difluoride etching.

In certain processes, non-etchant gas additive(s) are included to increase the selectivity of the silicon etch. Preferred additives for this purpose are non-halogen-containing gases. A single such additive or a mixture of such additives can be used. In preferred embodiments of this invention, the additives are those whose molar-averaged formula weight (expressed in daltons or grams per mole) is less than the formula weight of molecular nitrogen, preferably about 25 or less, still more preferably within the range of from about 4 to about 25, still more preferably within the range of from about 4 to about 20, and most preferably within the range of from about 4 to about 10. If a single additive species is used, the "molar-averaged formula weight" is the actual formula weight of that species, whereas if two or more additive species are used in the same gas mixture, the molar-averaged formula weight is the average of the formula weights of each species in the mixture (exclusive of the noble gas fluoride) calculated on the basis of the relative molar amounts (approximately equal to the partial pressures) of each species. In terms of thermal conductivity, preferred additives are those whose thermal conductivity at 300 K (26.9° C.) and atmospheric pressure ranges from about 10 mW/(m K) (i.e., milliwatts per meter per degree Kelvin) to about 200 mW/(m K), and most preferably from about 140 mW/(m K) to about 190 mW/(m K). In general, the higher the thermal conductivity of the additive, the greater the improvement in selectivity. Examples of additives suitable for use in this invention are nitrogen (N2, thermal conductivity at 300 K: 26 mW/(m K)), argon (Ar, thermal conductivity at 300 K: 18 mW/(m K)), helium (He, thermal conductivity at 300 K: 160 mW/(m K)), neon (Ne, thermal conductivity at 300 K: 50 mW/(m K)), and mixtures of two or more of these gases. Preferred additive gases are helium, neon, mixtures of helium and neon, or mixtures of one or both of these with one or more non-etchant gases of higher formula weight such as nitrogen and argon. Particularly preferred additives are helium and mixtures of helium with either nitrogen or argon.

The degree of selectivity improvement may vary with molar ratio of the additive to the etchant gas. Here again, the molar ratio is approximately equal to the ratio of the partial pressures, and in this case the term "molar ratio" denotes the ratio of the total number of moles of the additive gas (which may be more than one species) divided by the total number of moles of the etchant gas (which may also be more than one species). In most cases, best results will be obtained with a molar ratio of additive to etchant that is less than about 500:1, preferably within the range of from about 1:1 to about 500:1, preferably from about 10:1 to about 200:1, and most preferably from about 20:1 to about 150:1.

The temperature at which the etch process is conducted can likewise vary, although the partial pressure of the etchant gas will vary with temperature. The optimal temperature may depend on the choice of etchant gas, gaseous additive or both. In general, and particularly for procedures using xenon difluoride as the etchant gas, suitable temperatures will range from about −60° C. to about 120° C., preferably from about −20° C. to about 80° C., and most preferably from about 0° C. to about 60° C. For xenon difluoride, the silicon etch rate is inversely proportional to the temperature over the range of −230° C. to 60° C. The improvement in selectivity can thus be further increased by lowering the etch process temperature.

The flow parameters will be selected such that the time during which the sample will be exposed to the etchant gas will be sufficient to remove all or substantially all of the silicon. The expression "substantially all of the silicon" is used herein to denote any amount sufficient to permit the finished product to function essentially as effectively as if all of the silicon had been removed. An advantage of the high selectivity achieved with this invention is that it permits overetching of the silicon without significant loss of the non-silicon material. The time required for this to occur will vary with the amount of silicon to be removed and the dimensions and geometry of the silicon layer. In most cases, best results will be achieved with an exposure time lasting from about 30 seconds to about 30 minutes, preferably from about 1 minute to about 10 minutes. An example of the structures to which this invention will be applied is that depicted in U.S. Pat. No. 5,835,256, in which a silicon nitride layer is deposited over a polysilicon layer, and the silicon nitride layer is patterned to leave vias that define the lateral edges of the mirror elements. Access to the sacrificial polysilicon layer is through the vias, and the etching process removes the polysilicon below the vias by etching in the vertical direction (i.e., normal to the planes of the layers) while also removing the polysilicon underneath the silicon nitride by etching in the lateral direction (parallel to the planes of the layers). The process is also effective for etching silicon relative to multiple non-silicon layers.

The process design shown in FIG. 1 is but one of many designs in which recirculation in accordance with the present invention can be achieved. The FIG. 1 design itself can be used with many different combinations and sequences of valve openings and closings. One such sequence is as follows:

1. Solid or liquid etchant material (such as XeF2) is placed in the source chamber(s) 11.

2. A sample 14 is placed in the etch chamber 15.

3. The expansion chamber 12 and the etch chamber 15 are each evacuated.

4. The expansion chamber 12 and the etch chamber 15 are preconditioned by a) flooding one or both of the chambers with an inert gas (such as N2, for example), b) implementing a temperature ramp (e.g. consisting of raising the temperature of one or both of the chambers for fixed time followed by cooling the temperature of one or both chambers after step 5 and finishing with raising the temperature of one or both chambers after step 15), or c) both flooding and implementing temperature ramp. The sample temperature can be ramped to match or differ from than the chamber temperature ramp.

5. Both the expansion chamber 12 and the etch chamber 15 are then evacuated.

6. The expansion chamber 12 and the etch chamber 15 are then filled with one or more diluents from the individual gas sources 19, 20.

7. The expansion chamber 12 is then evacuated.

8. The expansion chamber 12 is then filled with XeF2 gas from the source chamber(s) 11 (generated by sublimation from the XeF2 crystals in the source chamber).

9. XeF2 gas is then pumped out of the expansion chamber 12 by the vacuum pump 23 to lower the XeF2 gas pressure in the expansion chamber to the desired XeF2 process pressure to be used for etching the sample.

10. One or more diluent gases from the gas sources 19, 20 are then added to the expansion chamber 12.

11. All valves are then closed except the manual needle valves.

12. The recirculation pump 18 is then activated to start a flow of diluent gas through the etch chamber 15.

13. The shutoff valves 26, 27 on the XeF2 recirculation loop are then opened to cause XeF2 gas to enter the recirculation loop 36.

14. Recirculation of the XeF2 gas through the etch chamber is continued until the sample is etched to completion.

15. Both the expansion chamber 12 and the etch chamber 15 are then evacuated.

16. The expansion chamber 12 and the etch chamber 15 are post-conditioned by a) flooding one or both of the chambers with an inert gas, b) increasing the temperature of one or both of the chambers, c) pumping out one or both of the chambers, or d) following a time ordered sequence of one or more of flooding/heating/evacuating.

17. The finished sample is then removed from the etch chamber. This procedure can be varied without detriment to the product quality. Steps 12 and 13, for example, can be performed in reverse order. Other variations will be apparent to those skilled in the art.

EXAMPLE

For etching a 6" glass substrate with MEMS devices, typical apparatus and process parameters include: double source chamber design with 11a at 28 C, 11b at 31 C and intermediate connector piece at 35 C. Expansion chamber 12 and etch chamber 15 at 23 C. In step 6 above, both chambers 12 and 15 are filled with a mixture of 45 T Nitrogen (N2) and 450 T Helium (He); total gas pressure is 495 T. In step 8, the chamber 12 is filled with XeF2 gas above 4.2 T. In step 9, the XeF2 gas in chamber 12 is reduced to 4 T for use in the process. In step 10, chamber 12 receives 47 T of Nitrogen (N2) and 470 T of Helium (He); total gas pressure in chamber 12 at the end of step 10 is 521 T.

Sacrificial silicon layers that can be removed using the apparatus and method of this invention may be layers of crystalline silicon, amorphous silicon, partially crystalline silicon, crystalline silicon of multiple crystal sizes, polysilicon in general, and silicon doped with such dopants as arsenic, phosphorus or boron. Polysilicon is of particular interest, although the relative crystalline vs. amorphous character of polysilicon will vary considerably with the deposition conditions, the presence or absence of dopants and impurities, and the degree of annealing.

Silicon can be preferentially removed relative to non-silicon materials by the method and apparatus of this invention. The term "non-silicon material" denotes any material that contains neither amorphous nor crystalline silicon in any of the forms described in the preceding paragraph. Non-silicon materials thus include silicon-containing compounds in which elemental silicon is bonded to another element, as well as non-silicon elements and compounds of non-silicon elements. Examples of such non-silicon materials are titanium, gold, tungsten, aluminum, and compounds of these metals, as well as silicon carbide, silicon nitride, photoresists, polyimides, and silicon oxides. Silicon nitride and silicon oxide are of particular interest in view of their use in the structures disclosed in U.S. Pat. No. 5,835,256. Two or more different non-silicon materials may be present in a single structure, and selectivity of the silicon etch relative to all such non-silicon materials will be improved.

When the present invention is applied to the mirror structures disclosed in U.S. Pat. No. 5,835,256, to remove silicon layers from those structures, the thickness and lateral dimensions of the layers may vary. The silicon portion will generally however be a layer having a thickness of from about 200 nm to about 5,000 nm, preferably from about 250 nm to about 3,000 nm, and most preferably from about 300 nm to about 1,000 nm. Similarly, the non-silicon portion will generally be a layer with a thickness of from about 10 nm to about 500 nm, preferably from about 20 nm to about 200 nm, and most preferably from about 30 nm to about 200 nm. The lateral distance that the etching process must extend under the typical silicon nitride mirror element in the structures of U.S. Pat. No. 5,835,256 in order to remove all of the underlying polysilicon (this distance typically being half the shortest lateral dimension of the mirror when the etching front travels inward from opposing edges) may range from a submicron distance to about 500 microns, preferably from about 3 microns to about 30 microns, and most preferably from about 5 microns to about 15 microns.

While much of the foregoing description is directed to applications of the present invention to etching processes, the invention, and particularly its recirculation aspect, is applicable in general to processes for adding or removing layers within a device, particularly layers that have microscopic dimensions. Examples of such processes are passivation and etching of semiconductor devices and MEMS/MOEMS devices, lithography (screen printing, for example), thin-film deposition (chemical vapor deposition e.g. application of self-assembled monolayers and spluttering, for example), electroplating (blanket and template-delimited electroplating of metals, for example), and directed deposition (as used in electroplating, stereolithography, laser-driven chemical vapor deposition, screen printing, and transfer printing, for example). Further examples are plasma etching, reaction-ion enhanced etching, deep reactive ion etching, wet chemical etching, electron discharge machining, bonding (such as fusion bonding, anodic bonding, and the application of adhesives), surface modification (such as wet chemical modification and plasma modification), and annealing (such as thermal or laser annealing). The process gases in each case will be readily apparent to those skilled in the respective arts. The present invention is also useful in processes where at least one of the components of the process gas is corrosive to metal in the presence of water vapor. Corrosive components can be used for adding or removing material in a microscopic device without picking up impurities that will lower the product yield and that might damage the pump used in the recirculation loop.

Further variations within the scope of the present invention are as follows. The recirculation loop 36 of FIG. 1 can be expanded to include the source chamber(s) 11. A valve arrangement can be incorporated into the design that allows the operator to choose between placing the source chamber within the recirculation loop and isolating the source chamber from the recirculation loop. Similarly, diluent gas can be added to the recirculation loop simultaneously with the process gas, and an appropriate valve arrangement can be incorporated that would provide the operator with the option to do so. Appropriate valve arrangements can also provide the option of extending the recirculation loop 36 through the etch chamber 15 only or through both the etch chamber 15 and the expansion chamber 12.

As also noted above, a filter 39 can be placed in the recirculation loop 36 to filter out at least one (and preferably all) of the byproducts or effluent produced by the reactions occurring in the etch chamber 15. This improvement may be applied to an etching or deposition process with or without energetically enhancing the process gas. A selective filter that allows the process gas to pass would be preferred. Of course, the filter can be a basic particulate filter as well. Again, these are only examples. Other variations and modifications will be readily apparent to those skilled in the art.

The foregoing description and examples are offered primarily for purposes of illustration. It will be readily apparent to those skilled in the art that numerous modifications and variations beyond those described herein can be made while still falling within the spirit and scope of the invention.

What is claimed is:

1. Apparatus for etching a simple, said apparatus comprsing:
   (a) a source of etchant gas selected from a noble gas halide and a halogen halide;
   (b) an etching chamber in communication with said source of etchant gas;
   (c) a recirculation loop passing through said etching chamber;
   (d) a valve connecting the source to the recirculation loop such that the etchant gas can be introduced into the recirculation loop when the valve is turned on, and the source can be disconnected from the recirculation loop when the valve is shut off; and
   (e) a pump disposed within said recirculation loop for recirculating etchant gas along said recirculation loop so as to recirculate the etchant gas in the recirculation loop while the source is disconnected from the recirculation loops.

2. Apparatus in accordance with claim 1 in which said gas flow spreading means is a baffle.

3. Apparatus in accordance with claim 1 in which said gas flow spreading means is a perforated plate.

4. Apparatus in accordance with claim 1, further comprising an energy source and/or electric field source at the etching chamber for forming a plasma therein.

5. Apparatus in accordance with claim 1 further comprising a filter disposed within said recirculation loop, said filter being one that removes a member selected from the group consisting of byproducts or effucent from gases flowing through said recirculation loop, or particulates.

6. Apparatus in accordance with claim 1 in which said pump is a dry pump.

7. Apparatus in accordance with claim 6 in which said dry pump has not wet seals and adds no gas to said recirculation loop.

8. Apparatus in accordance with claim 7 in which said dry pump is a bellows pump.

9. Apparatus in accordance with claim 8 in which said bellows pump comprises a housing with bellows-type wall sections enclosing a hollow interior, and at least one partition disposed to divide said hollow interior into a plurality of sections.

10. Apparatus in accordance with claim 1 in which said pump is constructed to circulate etchant gas substantially continuously within said recirculation loop.

11. Apparatus in accordance with claim 1, wherein the source of etchant gas is a source of xenon difluoride crystals.

12. Apparatus in accordance with claim 1, wherein the source of etchant gas is a source of bromine trifluoride liquid.

13. The apparatus of claim 1, wherein the etchant gas is not condensed.

14. Apparatus in accordance with claim 1 in which said source of etchant gas comprises a source chamber.

15. Apparatus in accordance with claim 14 further comprising gas flow spreading means in said etching chamber for diverting incoming gas.

16. Apparatus in accordance with claim 14 in which said source of etchant gas further comprises fluoride crystals retained within said source chamber.

17. Apparatus in accordance with claim 16 in which said fluoride crystals are xenon difluoride crystals.

18. Apparatus in accordance with claim 14 further comprising an expansion chamber communicating with said source chamber and with a gas source for a gas other than said etchant gas, said expansion chamber arranged for mixing gas from said source chamber with gas from said gas source.

19. Apparatus in accordance with claim 18 in which said expansion chamber is in communication with said recirculation loop.

20. Apparatus in accordance with claim 18 in which said gas source for a gas other than said etchant gas comprises a plurality of gas sources, the gases from which, when mixed, yield a gaseous mixture with molar averaged molecular weight less than or equal to that of N2.

21. Apparatus in accordance with claim 20 in which said plurality of gas sources are sources of two or more members selected from the group consisting of Ar, Ne, He and N2.

22. Apparatus in accordance with claim 18 in which said pump is defined as a first pump and said apparatus further comprises a second pump arranged to draw gases from a member selected from the group consisting of said expansion chamber, said source chamber, and said recirculation loop.

23. Apparatus in accordance with claim 18 in which said gas source for a gas other than said etchant gas comprises a source of a gas with molar averaged molecular weight less than or equal to that of N2.

24. Apparatus in accordance with claim 23 in which said gas other than said etchant gas is a member selected from the group consisting of Ar, Ne, He and N2.

25. A method for etching a sample, said method comprising:
   (a) placing said sample in an etching chamber disposed within a gas recirculation loop, said etching chamber in communication with a source of etchant gas selected from a noble gas halide and a halogen halide, and said gas recirculation loop having a pump disposed therein;
   (b) passing etchant gas from said source of etchant gas into said etching chamber to expose said sample to said etchant gas; and
   (c) disconnecting the recirculation loop from the source; and
   (d) recirculating said etchant gas through said recirculation loop by way of said pump.

26. A method in accordance with claim 25 further comprising passing said etchant gas through an expansion chamber prior to step (b) and, while said etchant gas is in said expansion chamber, forming a mixture of said etchant gas with non-etchant gases, and step (b) comprises passing said etchant gas as part of said mixture into said etching chamber.

27. A method in accordance with claim 25 in which said pump is a continuous recirculation pump and step (c) comprises continuously recirculating said etchant gas through said recirculation loop.

28. A method in accordance with claim 25 further comprising bleeding etchant gas into said recirculation loop during step (c).

29. A method in accordance with claim 25, wherein the source of etchant gas comprises xenon difluoride.

30. A method in accordance with claim 25, wherein the source of etchant gas comprises bromine trifluoride.

31. The method of claim 25, wherein the step of recirculating said etchant gas through said recirculation loop further comprises:
shutting off a valve that connecting said source to said recirculation loop; and
recirculating the etchant gas in said recirculation loop by way of said pump.

32. A method comprising:
providing an apparatus according to claim 1;
providing a solid or liquid etchant selected from a noble gas halide and a halogen halide at said etchant source at a temperature and pressure sufficient to cause said etchant to vaporize;
providing a sample to be etched within the etching chamber;
passing the vaporized etchant through the etching chamber; and
recirculating the etchant multiple times through the etching chamber with said pump.

33. A method in accordance with claim 32, wherein the etchant gas is passed through the pump without additional gas being added thereto.

34. A method in accordance with claim 32, wherein the source of etchant gas comprises two chambers, wherein the temperature and/or pressure of one chamber is different from the pressure and/or temperature of the other so that predominantly liquid or solid etchant remains in one chamber and predominantly gas etchant is in the other, prior to passing into the recirculation path and etching chamber.

35. A method in accordance with claim 32 comprising heating the process gas so as to at least avoid condensation, and cooling the etching chamber and/or sample to improve selectivity between the silicon and non-silicon portions of the sample.

36. A method in accordance with claim 32 in which said sample comprises a silicon portion existing in at least one layer and one or more non-silicon portion existing in at least one layer, said silicon etchant is a fluoride gas selected from the group consisting of noble gas fluorides and halogen fluorides, and said gas is a gas mixture which further comprises a non-etchant gas additive at a partial pressure and a molar ratio relative to said fluoride gas such that said gas mixture achieves substantially greater etching selectivity toward said silicon portion than would be achieved with said fluoride gas alone.

37. A method in accordance with claim 36 in which said non-etchant gas additive is a member selected from the group consisting of nitrogen, argon, helium, neon, and mixtures thereof.

38. A method in accordance with claim 36 in which said non-etchant gas additive is a member selected from the group consisting of helium, a mixture of helium and nitrogen, and a mixture of helium and argon.

39. A method in accordance with claim 36 in which said fluoride is a xenon fluoride and said non-etchant gas additive is helium.

40. A method in accordance with claim 36 in which said non-silicon portion is a member selected from the group consisting of titanium, gold, tungsten, and compounds thereof.

41. A method in accordance with claim 36 in which said silicon portion is a silicon layer deposited over a substrate and said non-silicon portion is a layer of a member selected from the group consisting of silicon nitride, silicon carbide, and silicon oxide, deposited over said silicon layer, said non-silicon layer being patterned to leave vias therein for access of said gas to said silicon layer, the exposure of said sample to said gas being of sufficient duration to laterally etch away substantially all of said silicon layer by access through said vias.

42. A method in accordance with claim 32 in which said sample is a substrate for a member selected from the group consisting of a semiconductor and/or a MEMS device.

43. A method in accordance with claim 32 in which said sample is a substrate for a MEMS device.

44. A method in accordance with claim 32, wherein the etchant gas is passed through a baffle and a perforated plate within the etching chamber.

45. A method in accordance with claim 32, wherein the solid or liquid etchant comprises xenon difluoride crystals.

46. A method in accordance with claim 32, wherein the solid or liquid etchant comprises xenon difluoride crystals.

47. Apparatus for adding or removing a layer of material from a sample by contacting said sample with a process gas, said layer having at least one dimension less than 1 mm, said apparatus comprising:
(a) a source of said process gas selected from a noble gas halide and a halogen halide;
(b) a fabrication chamber in communication with said source of process gas;
(c) a recirculation loop passing through said fabrication chamber,
(d) a valve connecting the source to the recirculation loop such that the etchant gas can be introduced into the recirculation loop when the valve is turned on, and the source is disconnected from the recirculation loop when the valve is shut off; and
(e) a pump disposed within said recirculation loop for recirculating process gas along said recirculation loop so as to recirculate the etchant gas in the recirculation loop when the source is disconnected from the recirculation loop.

48. Apparatus in accordance with claim 47 in which said process gas corrodes metal in the presence of moisture.

49. Apparatus in accordance with claim 48 in which said moisture is water moisture.

50. Apparatus in accordance with claim 47 further comprising a filter disposed within said recirculation loop, said filter being one that removes a member selected from the group consisting of byproducts, particulates or effluents from gases flowing through said recirculation loop.

51. Apparatus in accordance with claim 47 in which said source of process gas is comprised of a member selected from the group consisting of (i) chamber retaining a said process gas and a condensed liquid phase of said process gas in equilibrium with said process gas, (ii) a pressurized chamber of said process gas, and (iii) a chamber retaining a solid condensed phase of said process gas.

52. Apparatus in accordance with claim 51 further comprising a source of pressurized diluent gas and an expansion chamber positioned to receive diluent gas from said source of diluent gas and process gas from said source of process gas and to mix said diluent gas and said process gas thus received.

53. Apparatus in accordance with claim 47 in which said source of process gas is comprised of first and second chambers, said first chamber retaining primarily a liquid or solid condensed form of said process gas, and said second chamber retaining said process gas evaporated or sublimed from said condensed form, said first and second chambers being maintained at different temperatures.

54. Apparatus in accordance with claim 47 in which said layer has at least one dimension less than 500 μm.

55. Apparatus in accordance with claim 47 in which said layer has at least one dimension less than 100 μm.

56. Apparatus in accordance with claim 47, wherein the source of etchant gas comprises a source of xenon difluoride crystals.

57. Apparatus in accordance with claim 47, wherein the source etchant gas comprises a source of bromine trifluoride liquid.

58. Apparatus for exposing a silicon-containing sample to a gas comprising a gaseous fluoride etchant selected from a noble gas fluoride and a halogen fluoride for etching silicon, said apparatus comprising:
  a flow-through etching chamber comprising:
    a sample support,
    entry and exit ports for said gas;
  a source chamber comprising a noble gas fluoride or halogen fluoride etchant in solid or liquid form, the source chamber and the etching chamber capable of being in fluid communication with each other;
  a recirculation loop and recirculation pump within the loop, the recirculation loop constructed to connect to the etching chamber at two locations to allow etching gas to flow into and out of the etching chamber, and the recirculation pump in communication with the etching chamber and adapted to pump etching gas repeatedly through the etching chamber;
  a valve connecting the source to the recirculation loop such that the etchant gas can be introduced into the recirculation loop when the valve is turned on, and the source is disconnected from the recirculation loop when the valve is shut off; and
  a pump disposed within said recirculation loop for recirculating etchant gas along said recirculation loop so as to recirculate the etchant gas in the recirculation loop when the source is disconnected from the recirculation loop.

59. Apparatus in accordance with claim 58, wherein the etchant is provided from xenon difluoride crystals in the source chamber.

60. Apparatus in accordance with claim 58, wherein the etchant is provided from bromine trifluoride in the source chamber.

61. Apparatus in accordance with claim 58 further comprising a baffle and perforated plates comprising parallel circular plates arranged coaxially within said flow-through chamber.

62. Apparatus in accordance with claim 61 in which said perforations in said perforated plate are of decreasing from the center of said perforated plate outward.

63. Apparatus in accordance with claim 62, further comprising a plasma generator at said etching chamber.

64. Apparatus for etching silicon from a sample by exposing said sample to a gas comprising a silicon etchant selected from a noble gas halide and a halogen halide, said apparatus comprising:
  a source of etchant gas selected from a noble gas halide and a halogen halide;
  a flow-through chamber having:
    a sample support,
    entry and exit ports for said etchant gas,
    a perforated plate between said entry port and said sample support, and
    a baffle between said entry port and said perforated plate, said baffle positioned to deflect said etchant gas from said etchant port radially toward the periphery of said perforated plate, and said perforated plate containing an array of perforations arranged to distribute said deflected etchant gas over all exposed surfaces of said sample; and
  a reciprocating pump driving said gas toward said entry port, said reciprocating pump comprising:
    an enclosed housing comprising bellows-type wall sections and a partition arranged to divide the interior of said housing into first and second chambers, said partition being movable in a reciprocating manner to cause collapse and extensions of said bellows-type wall sections whereby one chamber contracts while the other expands and vice versa;
    inlet and outlet ports for each chamber with controllable shutoff valves at each port; and
    a partition driver for moving said partition in a reciprocating manner and opening and closing said shutoff valves in a coordinating sequence, causing said chambers to draw fluid in through alternating inlet ports while discharging fluid through alternating outlet ports and thus together to produce a continuous outlet flow.

65. Apparatus in accordance with claim 64 in which said reciprocating pump draws gas from said exit port.

66. Apparatus in accordance with claim 64, wherein the source of etchant gas comprises a source chamber comprising xenon difluoride crystals.

67. Apparatus in accordance with claim 64, wherein the source of etchant gas comprises a source chamber bromine trifluoride liquid.

68. Apparatus for etching a sample by contacting the sample with a vapor fluoride etchant gas selected from a noble gas fluoride and a halogen fluoride:
  (a) a source of said fluoride etchant gas, said source of etchant gas being comprised of first and second chambers, said first chamber retaining primarily a liquid or solid condensed form of said fluoride etchant gas, and said second chamber retaining said fluoride etchant gas volatilized from said condensed form, said source comprising a temperature regulator for maintaining the first and second chambers at different temperatures;
  (b) an etching chamber in communication with said source of fluoride etchant gas for holding the sample to be etched by the fluoride etchant gas;
  (c) a recirculation loop passing through said etching chamber;
  (d) a valve connecting the source to the recirculation loop such that the etchant gas can be introduced into the recirculation loop when the valve is turned on, and the source if disconnected from the recirculation loop when the valve is shut off; and
  (e) a pump disposed within said recirculation loop for recirculating etchant gas along said recirculation loop so as to recirculate the etchant gas in the recirculation loop when the source is disconnected from the recirculation loop.

69. Apparatus in accordance with claim 68, wherein the cooling unit is adapted to cool the process gas, one or more of the aforementioned chambers and/or sample below room temperature.

70. Apparatus in accordance with claim 68, wherein the cooling unit is adapted to cool in the range of from about 1 to 15 degrees C.

71. Apparatus in accordance with claim 68, wherein the dielectric is a silicon nitride or silicon oxide layer.

72. Apparatus in accordance with claim 68, wherein the source of said fluoride etchant gas comprises xenon difluoride crystals.

73. Apparatus in accordance with claim 68, wherein the source of said fluoride etchant gas comprises bromine trifluoride liquid.

74. Apparatus in accordance with claim 68, in the absence of a source of energy for energizing the etchant gas once in gas form.

75. Apparatus in accordance with claim 74, wherein the first source chamber comprises primarily liquid or crystals of a halogen or noble gas fluoride.

76. Apparatus in accordance with claim 74, further comprising a cooling unit for cooling the process gas, one or more of the aforementioned chambers and/or the sample being etched.

77. Apparatus in accordance with claim 74, wherein the sample comprises silicon and one or both of a dielectric and a metal, and the silicon is etched relative to the dielectric and/or metal.

78. Apparatus in accordance with claim 74, wherein the first source chamber is held at a temperature less than the second source chamber.

79. Apparatus in accordance with claim 78, further comprising a recirculation path for recirculating the fluoride etchant gas repeatedly through the etching chamber.

80. Apparatus in accordance with claim 78, wherein the two source chambers are maintained at more than 3 degrees C difference.

81. Apparatus in accordance with claim 80, wherein both source chambers are maintained at temperatures under 40 degrees C.

82. Apparatus for etching a sample comprising a silicon material and a dielectric material, comprising:
 a source of a noble gas halide and/or halogen halide etchant gas;
 an etching chamber in communication with the source of the etchant gas;
 a surface within the etching chamber for holding the sample to be etched;
 a cooling unit for cooling the surface, etching chamber and/or etching gas within the etching chamber below room temperature.

83. Apparatus according to claim 82, wherein the source comprises a source chamber having therein a liquid or solid noble gas halide or halogen halide.

84. Apparatus according to claim 83, further comprising a sample held by a holder, the sample comprising a sacrificial silicon portion and a dielectric portion.

85. Apparatus according to claim 82, wherein the source chamber comprises xenon difluoride crystals and/or bromine trifluoride liquid.

86. Apparatus according to claim 82, comprising a second source chamber connected to said source chamber and maintained at a temperature higher than the temperature of said source chamber.

87. Apparatus in accordance with claim 82, wherein the source of etchant gas comprises xenon difluoride crystals.

88. Apparatus in accordance with claim 82, wherein the source of etchant gas comprises bromine trifluoride liquid.

89. An apparatus for use in etching a sample, comprising:
 a source of an etchant gas selected from a noble gas halide and a halogen halide;
 an etching chamber having the sample and in communication with the source; and
 a recirculation loop passing through the etching chamber;
 a reciprocating pump disposed within said recirculation loop for recirculating the etchant gas along said recirculation loop.

90. The apparatus of claim 89, wherein the source is connected to the recirculation loop via a valve such that:
 (a) an amount of etchant gas can be introduced into the loop during etching; and
 (b) said amount of etchant flows within the recirculation for etching the sample when the source is disconnected from the recirculation loop by shutting off said valve.

91. An etching system for etching a sample, comprising:
 first means for containing an etchant gas selected from a noble gas halide and a halogen halide;
 second means in communication with the first means for holding the sample and providing an apace in which the sample can be etched with the etchant gas;
 a recirculation loop passing through said second means;
 third means for connecting the first means to the recirculation loop such that the etchant gas can be introduced into the recirculation loop when said third means is turned on, and the first means is disconnected from the recirculation loop when the third means is shut off; and
 fourth means disposed within said recirculation loop for recirculating the etchant gas along said recirculation loop so as to continuously recirculating the etchant gas in the recirculation loop when the first means is disconnected from the recirculation loop.

92. The etching system of claim 91, wherein the fourth means is a reciprocate pump.

93. The etching system of claim 91, further comprising:
 third means for maintaining the etchant gas within the etching system at a pressure such that the etchant gas has substantially no condensation.

94. A method for etching a sample, comprising:
 placing said sample in an etching chamber disposed within a gas recirculation loop, said etching chamber in communication with a source of etchant gas selected from a noble gas halide and a halogen halide, and said gas recirculation loop having a pump disposed therein;
 passing etchant gas from said source of etchant gas into said etching chamber to expose said sample to said etchant gas; and
 maintaining the etchant gas in the recirculation loop at a temperature so as to keep the etchant gas in vapor form.

95. The method of claim 94, wherein the step of recirculating the etchant gas further comprises:
 recirculating the etchant gas without introducing another etchant gas.

96. The method of claim 94, wherein the step of maintaining the etchant gas in the recirculation loop at a temperature so as to keep the etchant gas in vapor form further comprises:
 maintaining the etchant gas in the recirculation loop at a temperature so as to avoid condensation of the etchant gas.

97. The method of claim 94, wherein the step of maintaining the etchant gas in the recirculation loop further comprises:
 maintaining the etchant gas in the recirculation loop at a temperature so as to avoid the condensation of the etchant gas.

98. An apparatus for use in etching a sample, comprising:
 a source of an etchant gas selected from a noble gas halide and a halogen halide;

an etching chamber having the sample and in communication with the source; and a recirculation loop passing through the etching chamber;

a bellows pump disposed within said recirculation loop for recirculating the etchant gas along said recirculation loop.

99. A method for etching a sample, said method comprising:

(a) placing said sample in an etching chamber disposed within a gas recirculation loop, said etching chamber in communication with a source of etchant gas selected from a noble gas halide and a halogen halide, and said gas recirculation loop having a reciprocating pump disposed therein;

(b) passing etchant gas from said source of etchant gas into said etching chamber to expose said sample to said etchant gas; and (c) recirculating said etchant gas through said recirculation loop by way of said reciprocating pump.

100. A method comprising:

providing an apparatus according to claim 1;

providing a solid or liquid etchant selected from a noble halide and a halogen halide at said etchant source at a temperature and pressure sufficient to cause said etchant to vaporize;

providing a sample to be etched within the etching chamber;

passing the vaporized etchant through the etching chamber; and recirculating the etchant multiple times through the etching chamber with said reciprocating pump.

101. Apparatus for exposing a silicon-containing sample to a gas comprising a gaseous fluoride etchant selected from a noble gas fluoride and a halogen fluoride for etching silicon, said apparatus comprising:

a flow-through etching chamber comprising:
a sample support,
entry and exit ports for said gas;

a source chamber comprising a noble gas fluoride or halogen fluoride etchant in solid or liquid form, the source chamber and the etching chamber capable of being in fluid communication with each other;

a recirculation loop and reciprocating pump with the loop, the recirculation loop constructed to connect to the etching chamber at two locations to allow etching gas to flow into and out of the etching chamber, and the reciprocating pump in communication with the etching chamber and adapted to pump etching gas repeatedly through the etching chamber.

102. Apparatus for etching a sample by contacting the sample with a vapor fluoride etchant gas selected from a noble gas fluoride and a halogen fluoride;

(a) a source of said fluoride etchant gas, said source of etchant gas being comprised of first and second chambers, said first chamber retaining primarily a liquid or solid condensed form of said fluoride etchant gas, and said second chamber retaining said fluoride etchant gas volatilized from said condensed form, said source comprising a temperature regulator for maintaining the first and second chambers at different temperatures;

(b) an etching chamber in communication with said source of fluoride etchant gas for holding the sample to be etched by the fluoride etchant gas; and (c) a reciprocating pump in connection with the etching chamber and the source so as to recirculate the etchant gas through the etching chamber.

103. A method comprising:

providing an apparatus according to claim 1;

providing a solid or liquid etchant selected from a noble gas halide and a halogen halide at said etchant source at a temperature and pressure sufficient to cause and etchant to vaporize;

providing a sample to be etched within the etching chamber;

passing the vaporized etchant through the etching chamber;

recirculating the etchant multiple times through the etching chamber with said pump; and maintaining the etchant in the recirculation loop at a temperature so as to keep the etchant gas in vapor form.

104. The method of claim 103, wherein the step of maintaining the etchant gas in the recirculation loop further comprises:

maintaining the etchant gas in the recirculation loop at a temperature so as to avoid the condensation of the etchant gas.

* * * * *